United States Patent
Chung et al.

(10) Patent No.: US 9,231,078 B2
(45) Date of Patent: Jan. 5, 2016

(54) SEMICONDUCTOR AND MANUFACTURING METHOD THEREOF

(71) Applicant: Macronix International Co., Ltd., Hsinchu (TW)

(72) Inventors: Miao-Chun Chung, Miaoli County (TW); Yin-Fu Huang, Tainan (TW); Shih-Chin Lien, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 13/705,241

(22) Filed: Dec. 5, 2012

(65) Prior Publication Data

US 2014/0151764 A1 Jun. 5, 2014

(51) Int. Cl.
| | |
|---|---|
| H01L 29/66 | (2006.01) |
| H01L 29/78 | (2006.01) |
| H01L 29/10 | (2006.01) |
| H01L 29/08 | (2006.01) |

(52) U.S. Cl.
CPC ...... *H01L 29/66492* (2013.01); *H01L 29/1083* (2013.01); *H01L 29/7833* (2013.01); *H01L 29/0821* (2013.01)

(58) Field of Classification Search
CPC .......................... H01L 29/78; H01L 21/2652
USPC .......................... 257/552, E29.019, E21.544
See application file for complete search history.

(56) References Cited

U.S. PATENT DOCUMENTS

| | | |
|---|---|---|
| 4,701,775 A | 10/1987 | Cosentino et al. |
| 2002/0030244 A1 | 3/2002 | Pruijmboom et al. |
| 2004/0155257 A1 | 8/2004 | Yashita |
| 2009/0032850 A1 | 2/2009 | Alter |
| 2010/0019295 A1* | 1/2010 | Henderson et al. ........... 257/292 |
| 2011/0049677 A1* | 3/2011 | Huang et al. .................. 257/552 |
| 2011/0101453 A1* | 5/2011 | Lin et al. ....................... 257/339 |

FOREIGN PATENT DOCUMENTS

| | | |
|---|---|---|
| TW | 200721489 A | 6/2007 |
| TW | 201143091 A | 12/2011 |

OTHER PUBLICATIONS

Ciftcioglu et al, Integrated Silicon PIN Photodiodes Using Deep N-well in a Standard 0.18 mircometer CMOS technology, Aug. 1, 2009, vol. 27, No. 15.*
TW Office Action dated Apr. 21, 2015 in corresponding Taiwan application (No. 101145225).

* cited by examiner

*Primary Examiner* — Kyoung Lee
*Assistant Examiner* — Ratisha Mehta
(74) *Attorney, Agent, or Firm* — McClure, Qualey & Rodack, LLP

(57) ABSTRACT

A semiconductor element and a manufacturing method thereof are provided. The semiconductor element includes a base, an epitaxy layer, a first well, a second well, a third well, a first heavily doping region, a second heavily doping region, a implanting region and a conductive layer. The epitaxy layer is disposed on the base. The first well, the second well and the third well are disposed in the epitaxy layer. The third well is located between the first well and the second well. A surface channel is formed between the first heavily doping region and the second heavily doping region. The implanting region is fully disposed between the surface channel and the base and disposed at a projection region of the first well, the second well and the third well.

6 Claims, 8 Drawing Sheets

SEMICONDUCTOR AND MANUFACTURING METHOD THEREOF

BACKGROUND

1. Technical Field

The disclosure relates in general to a semiconductor element and a manufacturing method thereof, and more particularly to a metal oxide semiconductor field effect transistor and a manufacturing method thereof.

2. Description of the Related Art

With the development of semiconductor technology, varied semiconductor elements are provided. For example, a metal oxide semiconductor field effect transistor can be used in an analog circuit or a digital circuit.

In the metal oxide semiconductor field effect transistor, a base electrode and a source electrode may not directly connected and my result a body effect. According to the body effect, a gate voltage of the metal oxide semiconductor field effect transistor will be changed and affects the electric performance thereof.

SUMMARY

The disclosure is directed to a semiconductor element and a manufacturing method thereof. An implanting region is fully disposed, such that the body effect can be improved, and it is no needed to add any additional mask and any addition cost.

According to a second aspect of the present disclosure, a manufacturing method of a semiconductor element is provided. The manufacturing method of the semiconductor element includes the following steps. A base is provided. An epitaxy layer is formed on the base. A first well and a second well are formed in the epitaxy layer. An implanting region is fully disposed in the epitaxy layer. Next, a third well is formed in the epitaxy layer and located between the first well and the second well. The step of forming the third well is performed after the step of forming the implanting region. A first heavily doping region and a second heavily doping region are respectively formed in the first well and the second well. A surface channel is formed between the first heavily doping region and the second heavily doping region. The implanting region is located between the surface channel and the base and is disposed at a projection region of the first well, the second well and the third well. A conductive layer is formed above the surface channel.

According to a third aspect of the present disclosure, a manufacturing method of a semiconductor element is provided. The manufacturing method of the semiconductor element includes the following steps. A base is provided. An epitaxy layer is formed on the base. A third well is formed in the epitaxy layer. An implanting region is fully disposed in the epitaxy layer. A first well and a second well are formed in the epitaxy layer. The third well is located between the first well and the second well. The step of forming the first well and the second well is performed after the step of forming the implanting region. A first heavily doping region and a second heavily doping region are respectively formed in the first well and the second well. A surface channel is formed between the first heavily doping region and the second heavily doping region. The implanting region is located between the surface channel and the base and is disposed at a projection region of the first well, the second well and the third well. A conductive layer is formed above the surface channel.

The above and other aspects of the disclosure will become better understood with regard to the following detailed description of the non-limiting embodiments. The following description is made with reference to the accompanying drawings.

DETAILED DESCRIPTION

Preferred embodiments are disclosed below for elaborating the invention. An implanting region is fully disposed, such that the body effect can be improved, and it is no needed to add any additional mask and any addition cost. However, the following embodiments are for the purpose of elaboration only, not for limiting the scope of protection of the invention. Besides, secondary elements are omitted in the following embodiments to highlight the technical features of the invention.

First Embodiment

Figure 1A:
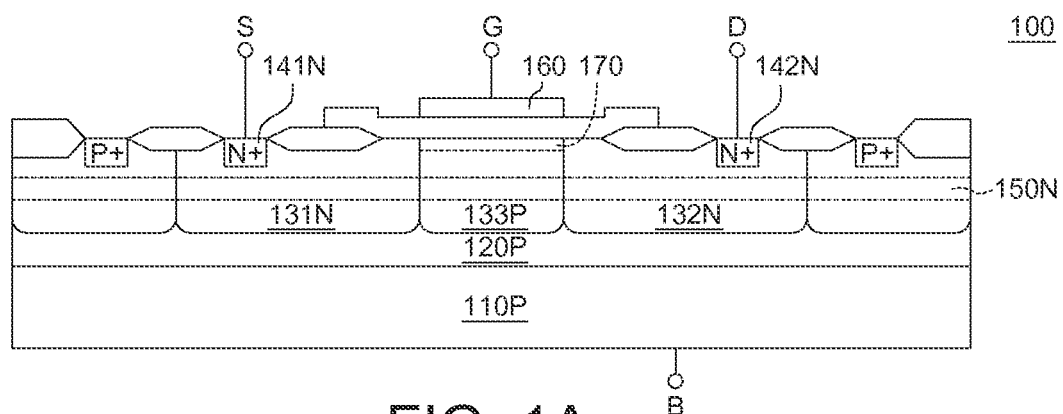
FIG. 1A shows a semiconductor element according to a first embodiment of the present invention.
Figure 1B:
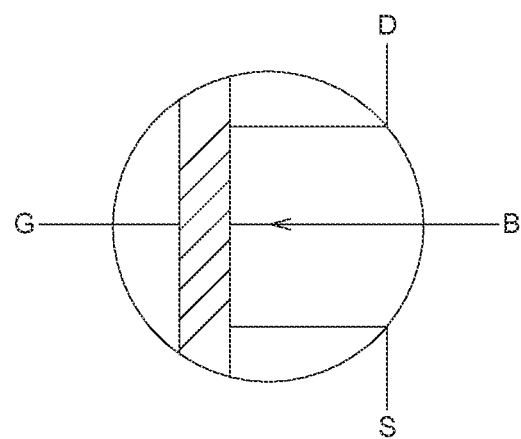
FIG. 1B shows a circuit diagram of the semiconductor of FIG. 1.

Please referring to FIGS. 1A to 1B, FIG. 1A shows a semiconductor element 100 of the first embodiment of the present invention, and FIG. 1B shows a circuit diagram of the semiconductor element 100 of FIG. 1A. For example, the semiconductor element 100 of the present embodiment can be a NMOS. The semiconductor element 100 includes a base 110P, an epitaxy layer 120P, a first well 131N, a second well 132N, a third well 133P, a first heavily doping region 141N, a second heavily doping region 142N, an implanting region 150N and a conductive layer 160. The epitaxy layer 120P is disposed on the base 110P. The first well 131N is disposed in epitaxy layer 120P. The second well 132N is disposed in the epitaxy layer 120P. The third well 133P is disposed in the epitaxy layer 120P, and located between first well 131N and the second well 132N.

The first heavily doping region 141N is disposed in the first well 131N. The second heavily doping region 142N is disposed in the second well 132N. The first heavily doping region 141N is used for electrically connected to a source electrode S. The second heavily doping region 142N is used for electrically connected to a drain electrode D.

The conductive layer 160 is disposed above the surface channel 170. The conductive layer 160 is used for electrically connected to a gate electrode G. The base 110P is electrically connected to a base electrode B. When the gate electrode G and the base electrode B are applied bias voltage, a surface channel 170 is formed between the first heavily doping region 141N and the second heavily doping region 142N. The implanting region 150N is fully disposed between the surface channel 170 and the base 110P (or the epitaxy layer 120P). In the present embodiment, the body effect can be improved by fully disposing the implanting region 150N.

In the present embodiment, the implanting region 150N, the first well 131N, the second well 132N, the first heavily doping region 141N and the second heavily doping region 142N have a first doping type, and the base 110P, the third well 133P and the epitaxy layer 120P have a second doping type. The first doping type and the second doping type are complementary. In the present embodiment, the first doping type and the second doping type can be N type and P type respectively. In another embodiment, the first doping type and the second doping type can be P type and N type respectively.

The implanting region 150N is continuously disposed at a projection region of the first well 131N, the second well 132N and the third well 133P, and is not only disposed at a projection region of the third well 133P.

The implanting region 150N is formed by fully implanting, and it is no needed to add any additional mask. A manufacturing method of the semiconductor element 100 of the present embodiment is illustrated in detail by a flow chart.

Figure 2A:
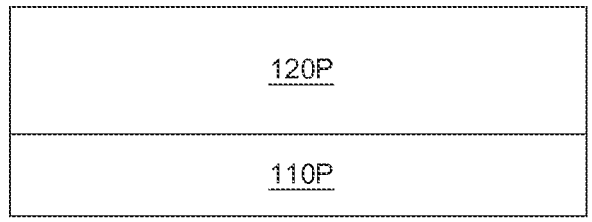
FIGS. 2A to 2E show a flow chart of a manufacturing method of the semiconductor element.

Please refer to FIGS. 2A to 2E, which show the flow chart of the manufacturing method of the semiconductor element 100. As shown in FIG. 2A, the base 110P is provided and the epitaxy layer 120P is formed on the base 110P.

Figure 2B:
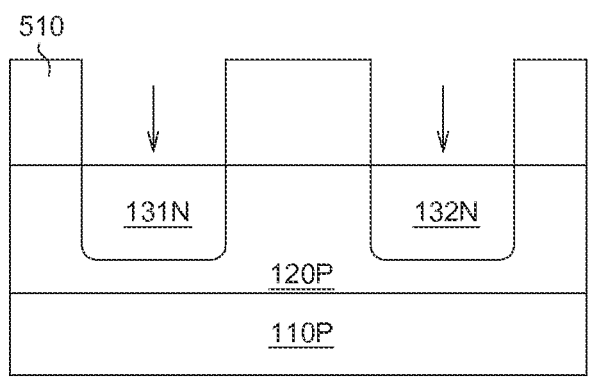

Afterwards, as shown in FIG. 2B, the first well 131N and the second well 132N are formed in the epitaxy layer 120P by using a photoresister layer 510 as a mask.

Figure 2C:
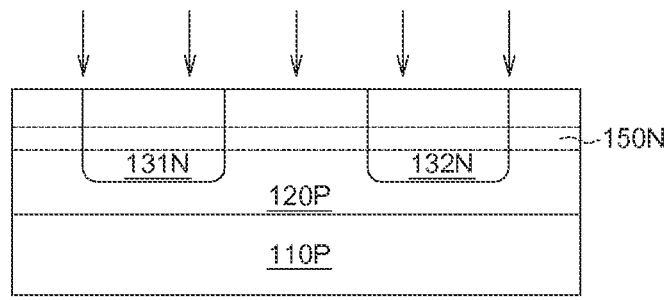

Then, as shown in FIG. 2C, the implanting region 150N is fully disposed in the epitaxy layer 120P. In this step, it is no needed to use any mask, and dopants are directly implanted. The doping energy can be controlled at 110K to 220K for implanting the dopants at a predetermined depth, such that the implanting region 150N can be controlled to be located between the base 110P and the surface channel 170 (shown in FIG. 1A) which is going to be formed.

Figure 2D:
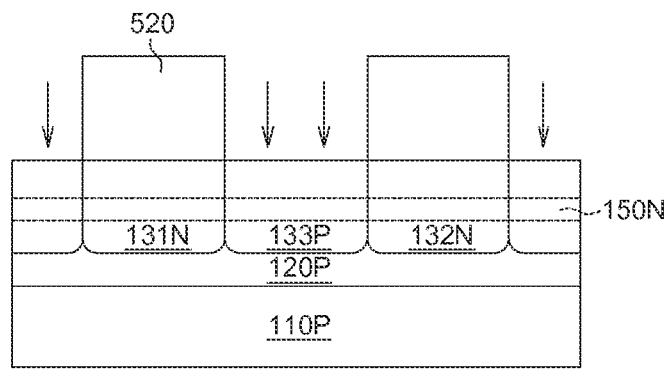

Afterwards, as shown in FIG. 2D, the third well 133P is formed in the epitaxy layer 120P by using a photoresister layer 520 as a mask. The third well 133P is located between the first well 131N and the second well 132N. The step of forming the third well 133P is performed after the step of forming the implanting region 150N. That is to say, the step of forming the implanting region 150N will not affect the step of forming the third well 133P.

Figure 2E:
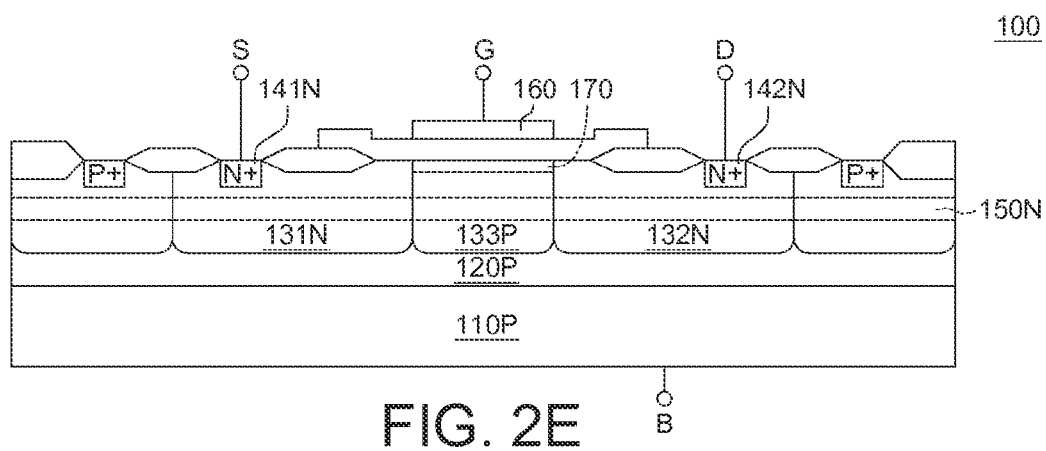

Then, as shown in FIG. 2E, the first heavily doping region 141N and the second heavily doping region 142N are formed in the first well 131N and the second well 132N respectively. The surface channel 170 will formed between the first heavily doping region 141N and the second heavily doping region 142N. Because the depth of the implanting region 150N has been controlled in the step shown in FIG. 2C, the implanting region 150N will be located between the surface channel 170 and the base 110P.

Afterwards, as shown in FIG. 2E, the conductive layer 160 is disposed above the surface channel 170. Thus, the semiconductor element 100 of the present embodiment is formed.

Figure 3:
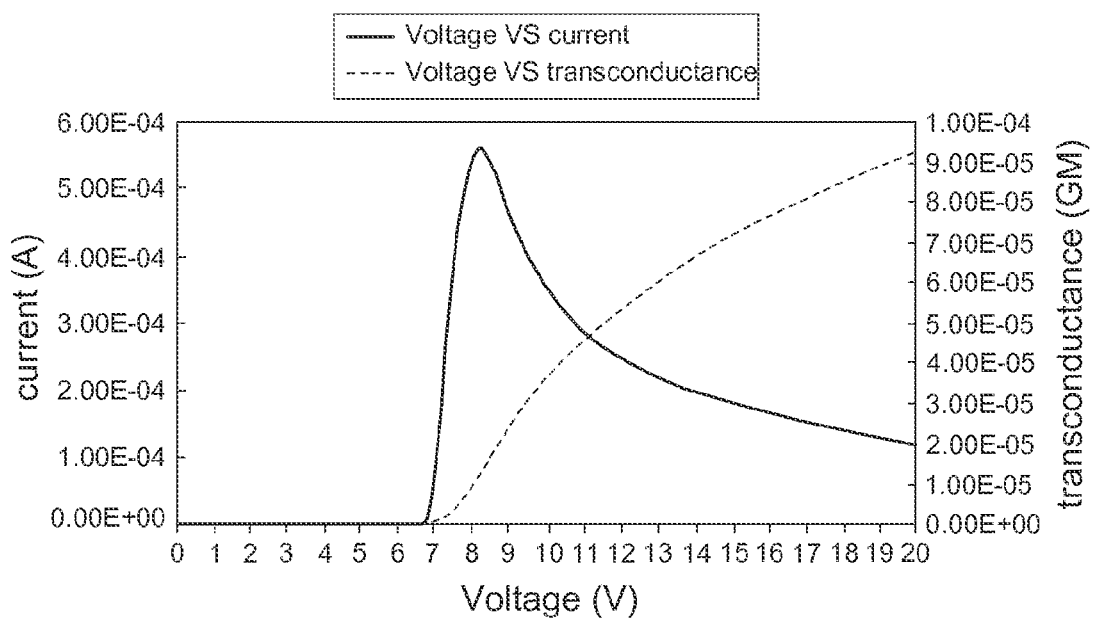
FIG. 3 shows a relationship between the voltage and the current at a gate electrode of a semiconductor element without any implanting region.

Please referring to FIGS. 1B and 3, FIG. 3 shows a relationship between the voltage and the current at a gate electrode of a semiconductor element without any implanting region 150N. When the base electrode B is applied −18 V, the drain electrode D is applied to 1 V and the source electrode S is applied to 0 V, the body effect is easy to result. Therefore, the gate electrode G must be applied up to 8 V for turning on the semiconductor element.

Figure 4:
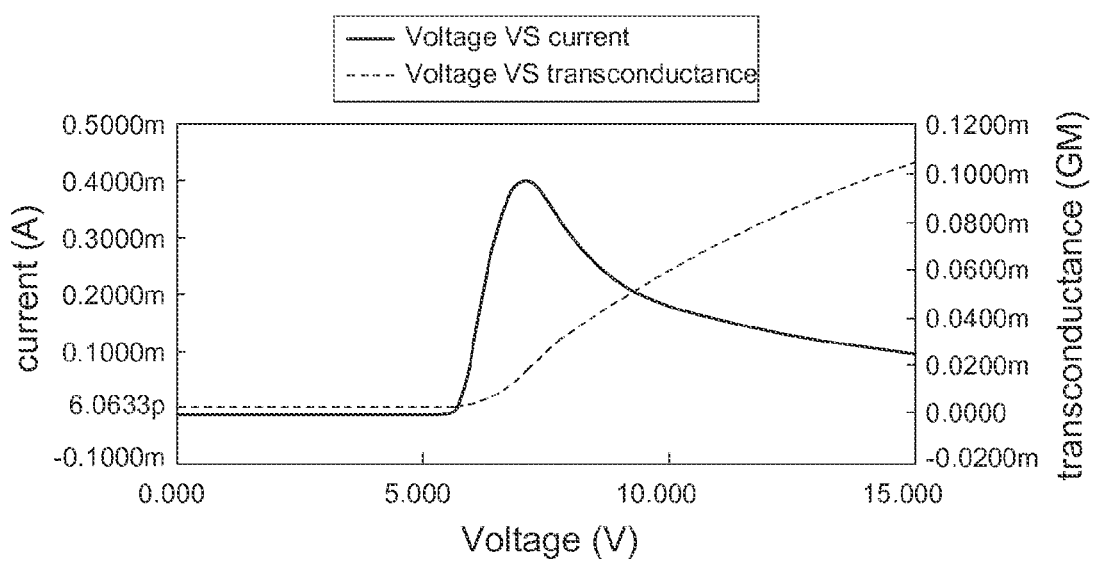
FIG. 4 shows a relationship between the voltage and the current at a gate electrode of the semiconductor element including an implanting region.

Please referring to FIGS. 1B and 4, FIG. 4 shows a relationship between the voltage and the current at a gate electrode G of the semiconductor element 100 including an implanting region 150N. When the base electrode B is applied to −18 V, the drain electrode D is applied to 1 V and the source electrode S is applied to 0 V, the implanting region 150N can improve the body effect. Therefore, the gate electrode G is just to be applied up to 5.79 V for turning on the semiconductor element.

Referring to the comparison between FIG. 3 and FIG. 4, at the same condition, the voltage of the gate electrode G of the semiconductor element 100 including the implanting region 150N can be reduced 2 to 3 V.

Figure 5:
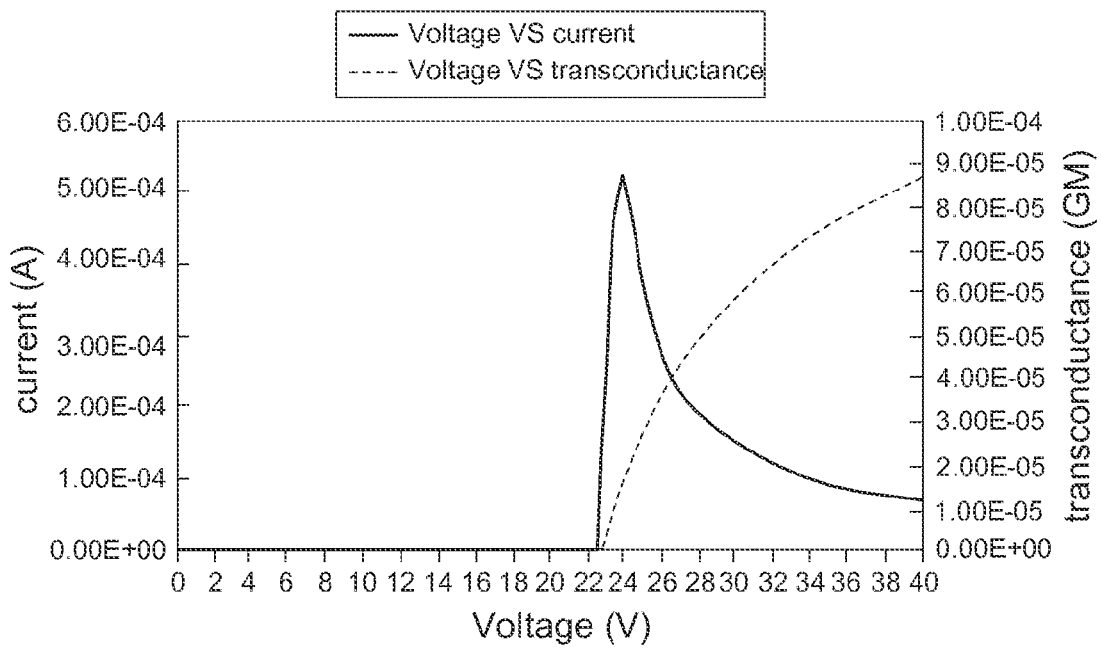
FIG. 5 shows a relationship between the voltage and the current at a gate electrode of a semiconductor element without any implanting region.

Please referring to FIGS. 1B and 5, FIG. 5 shows a relationship between the voltage and the current at a gate electrode of a semiconductor element without any implanting region 150N. When the base electrode B is applied −10 V, the drain electrode D is applied to 16 V and the source electrode S is applied to 15 V, the body effect is easy to result. Therefore, the gate electrode G must be applied up to 9 V for turning on the semiconductor element.

Figure 6:
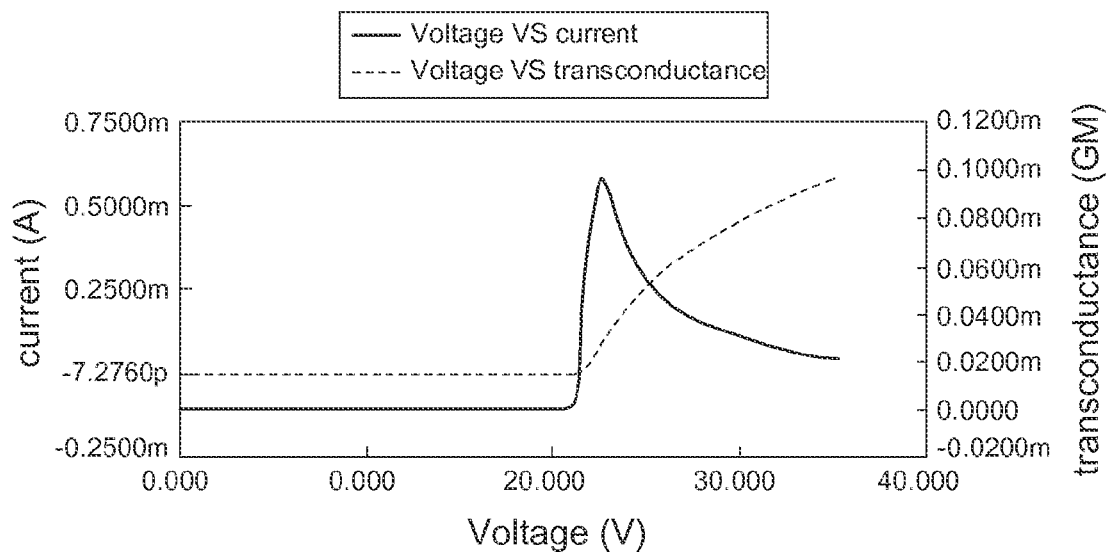
FIG. 6 shows a relationship between the voltage and the current at a gate electrode of the semiconductor element including an implanting region.

Please referring to FIGS. 1B and 6, FIG. 4 shows a relationship between the voltage and the current at a gate electrode G of the semiconductor element 100 including an implanting region 150N. When the base electrode B is applied to −10 V, the drain electrode D is applied to 16 V and the source electrode S is applied to 15 V, the implanting region 150N can improve the body effect. Therefore, the gate electrode G is just to be applied up to 6.13 V for turning on the semiconductor element.

Referring to the comparison between FIG. 5 and FIG. 6, at the same condition, the voltage of the gate electrode G of the semiconductor element 100 including the implanting region 150N can be raised 2 to 3 V.

Second Embodiment

Figure 7:
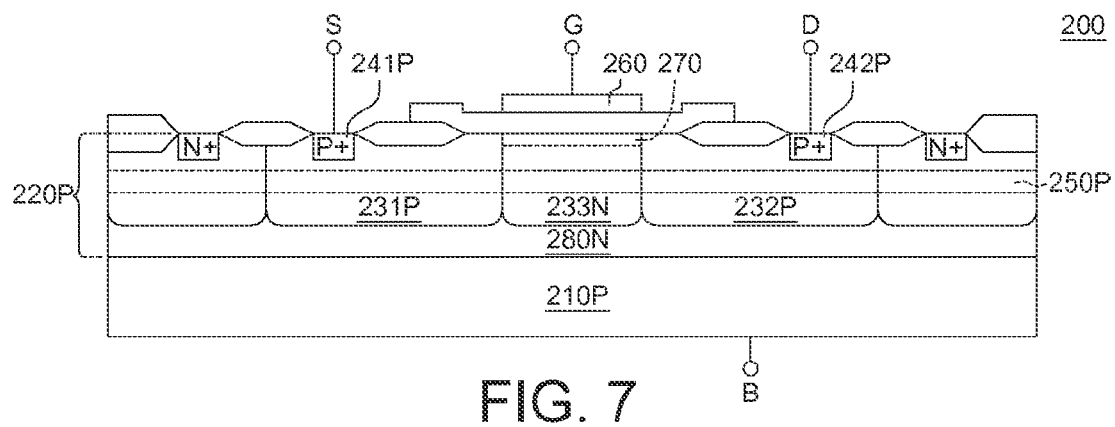
FIG. 7 shows a semiconductor element according to a second embodiment.

Please referring to FIG. 7, FIG. 7 shows a semiconductor element 200 according to a second embodiment. For example, the semiconductor element 200 can be a PMOS. In other embodiment, the semiconductor element 200 can be an isolation device.

In the present embodiment, the implanting region 250P, the first well 231P, the second well 232P, the first heavily doping region 241P, the second heavily doping region 242P, the base 210P and the epitaxy layer 220P have a P type doping, and the third well 233N and the barrier layer 280N have N type doping region.

The implanting region 250P is continuously disposed at a projection region of the first well 231P, the second well 232P and the third well 233N, and is not only disposed at a projection region of the third well 233N.

The implanting region 250P is formed by fully implanting. It is no needed to add any additional mask. The voltage of the gate electrode G connected to a conductive layer 260 can be raised by the implanting region 250P, and the absolute value thereof can be decreased. A manufacturing method of the semiconductor element 200 of the present embodiment is illustrated in detail by a flow chart.

Figure 8A:
FIGS. 8A to 8F show a flow chart of a manufacturing method of the semiconductor element.

Please refer to FIGS. 8A to 8F, which show the flow chart of the manufacturing method of the semiconductor element 200. As shown in FIG. 8A, the base 210P is formed and a barrier layer 280N is formed on the base 210P.

Figure 8B:
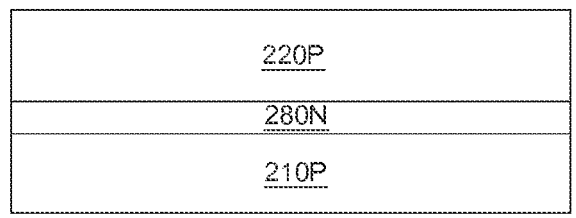

Afterwards, as shown in FIG. 8B, an epitaxy layer 220P are formed on the base 210P.

Figure 8C:
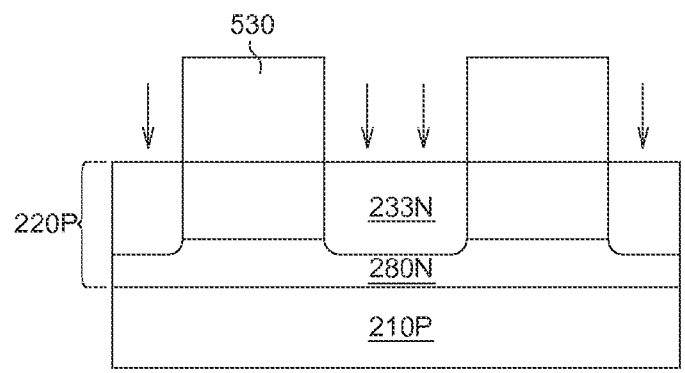

Next, as shown in FIG. 8C, the third well 233N is formed in the epitaxy layer 220P by using a photoresister layer 530 as a mask.

Figure 8D:
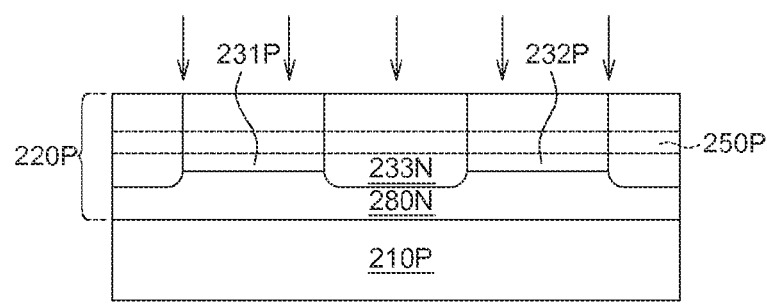

Afterwards, as shown in FIG. 8D, the implanting region 250P is fully disposed in the epitaxy layer 220P. In this step, there is no needed to use any mask and dopants are directly implanted. The doping energy can be controlled at 110K to 220K for implanting the dopants at a predetermined depth, such that the implanting region 250P can be controlled to be located between the base 210P and the surface channel 270 (shown in FIG. 7).

Figure 8E:
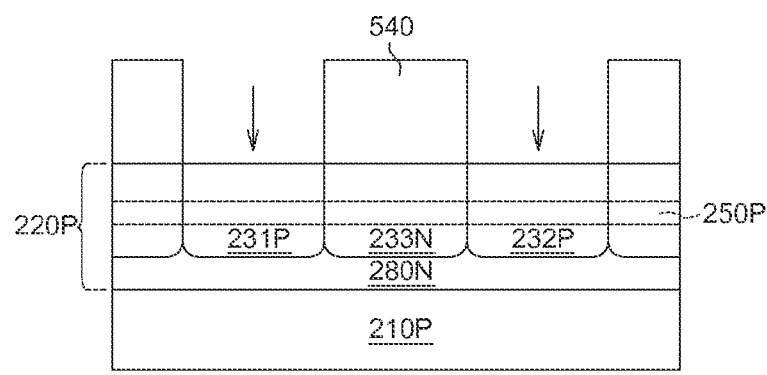

Then, as shown in FIG. 8E, the first well 231P and the second well 232P are formed in the epitaxy layer 220P by using another photoresister layer 540 as a mask. The third well 233N is located between the first well 231P and the second well 232P. The step of forming the third well 233N is performed after the step of forming the implanting region 250P. That is to say, the step of forming the implanting region 250P will not affect the step of forming the first well 231P and the second well 232P.

Figure 8F:
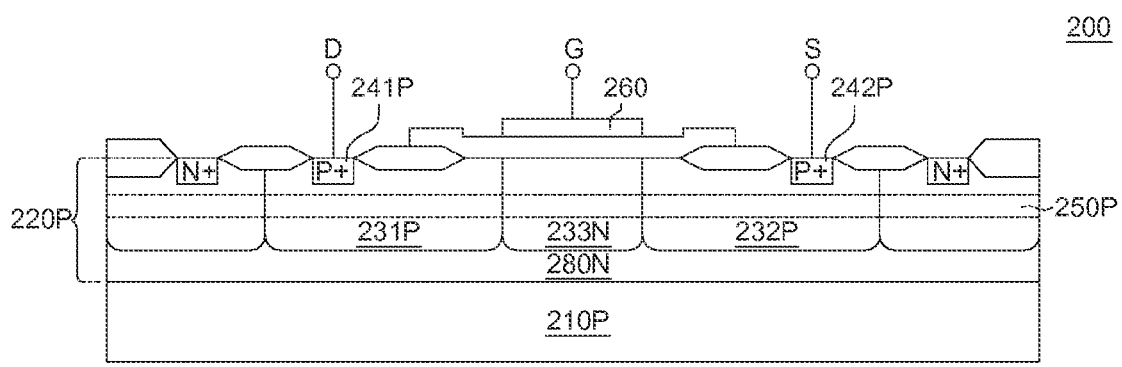

Afterwards, as shown in FIG. 8F, the first heavily doping region 241P and the second heavily doping region 242P are formed in the first well 231P and second well 232P respectively. The surface channel 270 will formed between the first heavily doping region 241P and the second heavily doping region 242P. Because the depth of the implanting region 250P has been controlled in the step shown in FIG. 8D, the implanting region 250P will be located between the surface channel 270 and the base 210P.

Then, as shown in FIG. 8F, the conductive layer 260 is disposed above the surface channel 270. Thus, the semiconductor element 200 is formed.

In the semiconductor elements 100, 200, the implanting regions 150N, 250P are fully disposed between the surface channels 170, 270 and the bases 110P, 210P, such that the body effect can be improved. Further, it is no needed to add any additional mask for forming the implanting regions 150N, 250P, and it will not affect the step of forming first wells 131N, 231P, the second wells 132N, 232P and the third wells 133P, 233N.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor element, comprising:
    a base;
    an epitaxy layer, formed by implanting a first doping dopants and disposed on the base;
    a first well, disposed in the epitaxy layer;
    a second well, disposed in the epitaxy layer;
    a third well, formed by implanting a second doping dopants and disposed in the epitaxy layer, and located between the first well and the second well;
    a first heavily doping region, located in the first well;
    a second heavily doping region, located in the second well, wherein a surface channel is formed between the first heavily doping region and the second heavily doping region;
    an implanting region, wherein the implanting region is formed by implanting a third doping dopants, fully disposed between the surface channel and the base, and disposed in part of the first well, part of the second well and part of the third well; the first well, the second well and the third well are located at a middle part of the epitaxy layer; and
    a conductive layer, disposed above the surface channel;
    wherein the doping type of the third dopants of the implanting region is complementary to that of the first dopants of the epitaxy layer and that of the second doping dopants of the third well, the bottom of the implanting region is above the bottom of the first well, the bottom of the second well and the bottom of the third well.

2. The semiconductor element according to claim 1, wherein the first well and the second well are formed by implanting a plurality of fourth dopants whose doping type is identical to that of the third dopants of the implanting region.

3. The semiconductor element according to claim 2, wherein the doping type of the third dopants and the fourth dopants is N type, and the doping type of the first dopants and the second dopants is P type.

4. The semiconductor element according to claim 2, wherein the doping type of the third dopants and the fourth dopants is P type, and the doping type of the first dopants and the second dopants is N type.

5. The semiconductor element according to claim 1, wherein the implanting region is continuously disposed at the projection region of the first well, the second well and the third well.

6. The semiconductor element according to claim 1, further comprising:
    a barrier layer, located on the base, wherein the implanting region is fully disposed between the surface channel and the barrier layer.

* * * * *